(12) United States Patent
Hartmann

(10) Patent No.: US 6,401,180 B1
(45) Date of Patent: Jun. 4, 2002

(54) BANK HISTORY TABLE FOR IMPROVED PRE-CHARGE SCHEDULING OF RANDOM ACCESS MEMORY BANKS

(75) Inventor: Alfred C. Hartmann, Round Rock, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/224,822

(22) Filed: Jan. 4, 1999

(51) Int. Cl.$^7$ ................................................ G06F 12/00
(52) U.S. Cl. ............................ 711/167; 711/5; 365/201
(58) Field of Search ............................ 711/167, 5, 105, 711/156, 137; 365/201; 713/320

(56) References Cited

U.S. PATENT DOCUMENTS

| | | | |
|---|---|---|---|
| 5,813,038 A | | 9/1998 | Thome et al. |
| 5,873,114 A | * | 2/1999 | Rahman et al. ............. 711/106 |
| 6,005,592 A | * | 12/1999 | Koizumi et al. ............ 345/517 |
| 6,052,756 A | * | 4/2000 | Barnaby et al. ............ 711/105 |

OTHER PUBLICATIONS

Rambus (Advance Information), "Direct RAC Data Sheet", Aug. 7, 1998, pp. 1–46.
Direct Rambus (Technology Disclosure), "1.6 GM/memory sec", Oct. 1997, pp. 1–16.
Rambus (Advance Information), "Direct RDRAM 256/288–Mbit (512K×16/18×32s)", Sep. 4, 1998, pp. 1–62.

* cited by examiner

Primary Examiner—Matthew Kim
Assistant Examiner—Matthew D. Anderson
(74) Attorney, Agent, or Firm—Zagorin, O'Brien & Graham, LLP

(57) ABSTRACT

A bank history table and precharge decision logic allows a memory controller to dynamically choose either to precharge a memory bank immediately after an access or to delay precharge based on the assumption that a subsequent access will be to the same row of the bank. The bank history table has a plurality of memory access history vectors. Each of the memory access history vectors corresponds to a respective one of a plurality of banks of memory. A precharge decision circuit is coupled to the bank history table and receives a selected one of the memory access history vectors and a new history bit. The precharge decision circuit makes a precharge prediction for the memory using the selected access history vector and the new history bit.

20 Claims, 3 Drawing Sheets

BANK HISTORY TABLE FOR IMPROVED PRE-CHARGE SCHEDULING OF RANDOM ACCESS MEMORY BANKS

BACKGROUND OF THE INVENTION

1. Field of the Invention

This invention relates to controlling memories and more particularly to scheduling of precharge operations on memories.

2. Description of the Related Art

Access to memory is a critical performance criteria in computer systems. Access prediction has been employed in high performance processor design to improve memory access performance. In such applications, processing efficiency is improved by dynamically predicting whether a conditional branch instruction will result in the branch being taken (discontinuous instruction fetch access) or in the branch not being taken (continuous instruction fetch access). However, such access prediction is limited to processors and typically to the occurrence of branch instructions and does not generally provide improved access to main system memory.

In computer systems, the main memory is typically composed of dynamic random access memory (DRAM) organized in banks as shown in FIG. 1. Typically, the high order portion of row address bits 10 are used to select the appropriate bank for each memory access. Within each bank, additional row address bits are used to select a specific row within each bank. The column address bits are supplied to each bank to select the columns within the bank that are being read. As is known in the art, between read accesses to a bank, a precharge operation takes place in the memory array to place the array in a state which allows the sense amplifiers to sense the values stored in the memory. In conventional DRAMs, those precharge operation are necessary in order to access a different row in the bank and are accomplished by bringing the row access strobe (RAS) inactive. In some current DRAMs such as the RAMBUS DRAM, precharge commands are provided to the DRAM. The precharge commands cause the selected bank to prepare the associated sense amplifiers so that a different row in that bank can be accessed.

It is known in the art that if the same row in a bank is being sequentially accessed, i.e., only the column bits are changing for the sequential access, the memory access can be performed without the time penalty of the precharge operation and without providing a new row address, and incurring a read access delay from the memory array.

Memory controllers have therefore adopted various approaches to precharge operations in order to maximize the throughput of the memory depending on the nature of the memory accesses. Memory controller 12 may be designed or programmed to perform memory bank pre-charge after each memory access. That approach would be desirable when the memory access pattern is highly random with frequent row misses. However, for highly localized access patterns with frequent row hits, the memory controller would have better performance by precharging only prior to an access of a different row of the bank.

In order to improve memory access performance, it would be desirable to have a memory controller that dynamically chooses between various approaches to precharge operations.

SUMMARY OF THE INVENTION

Accordingly, it has been discovered to provide a bank history table and associated control logic that allows the memory controller to dynamically choose either to precharge immediately after an access or to delay precharge, the choice being based on history bits indicating whether previous memory accesses were row hits or misses. The history bits are stored in the bank history table. A dynamic choice based upon access history can increase the probability of making a correct choice, that is, a choice that minimizes access response time.

In one embodiment, the invention provides an integrated circuit that includes a bank history table having a plurality of memory access history vectors. Each of the memory access history vectors corresponds to a respective one of a plurality of banks of memory. A precharge decision circuit, which is coupled to the bank history table, receives a selected one of the history vectors and a new history bit. The precharge decision circuit makes a precharge decision for the memory using the selected one of the memory access vectors and the new history bit. The new history bit is generated by comparing for equality the row number of the current row being accessed with a stored value of the last row accessed for that bank.

In another embodiment, the invention provides a method for providing a precharge decision for a memory having a plurality of banks of memory. The method includes providing a bank history table having a plurality of memory access history vectors corresponding to a respective one of the banks of memory. One of the memory access history vectors is provided to a precharge decision circuit according to a current bank address. The precharge decision circuit makes the precharge decision using the history vector provided.

BRIEF DESCRIPTION OF THE DRAWINGS

The present invention may be better understood, and its numerous objects, features, and advantages made apparent to those skilled in the art by referencing the accompanying drawings, in which.

DESCRIPTION OF THE PREFERRED EMBODIMENT(S)

Figure 1:
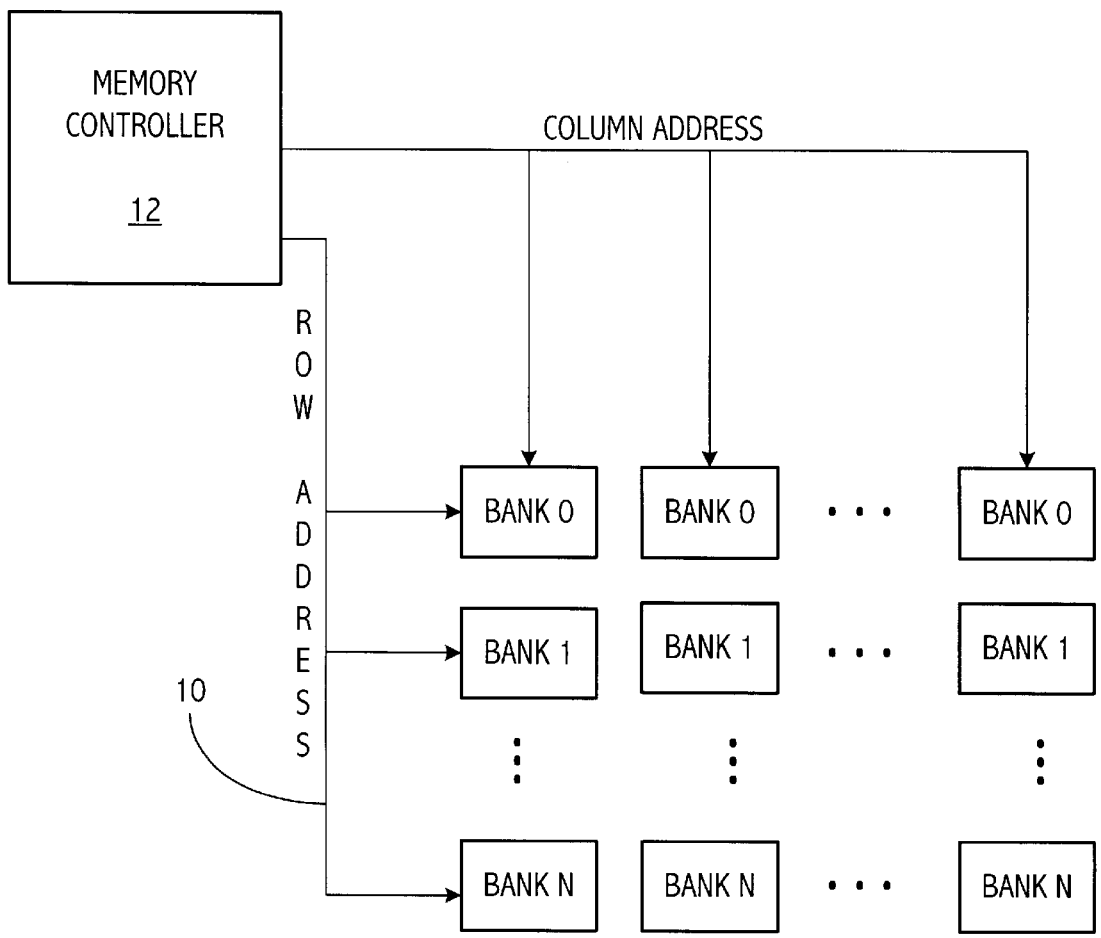
FIG. 1 depicts the organization of dynamic random access memory in banks.
Figure 2:
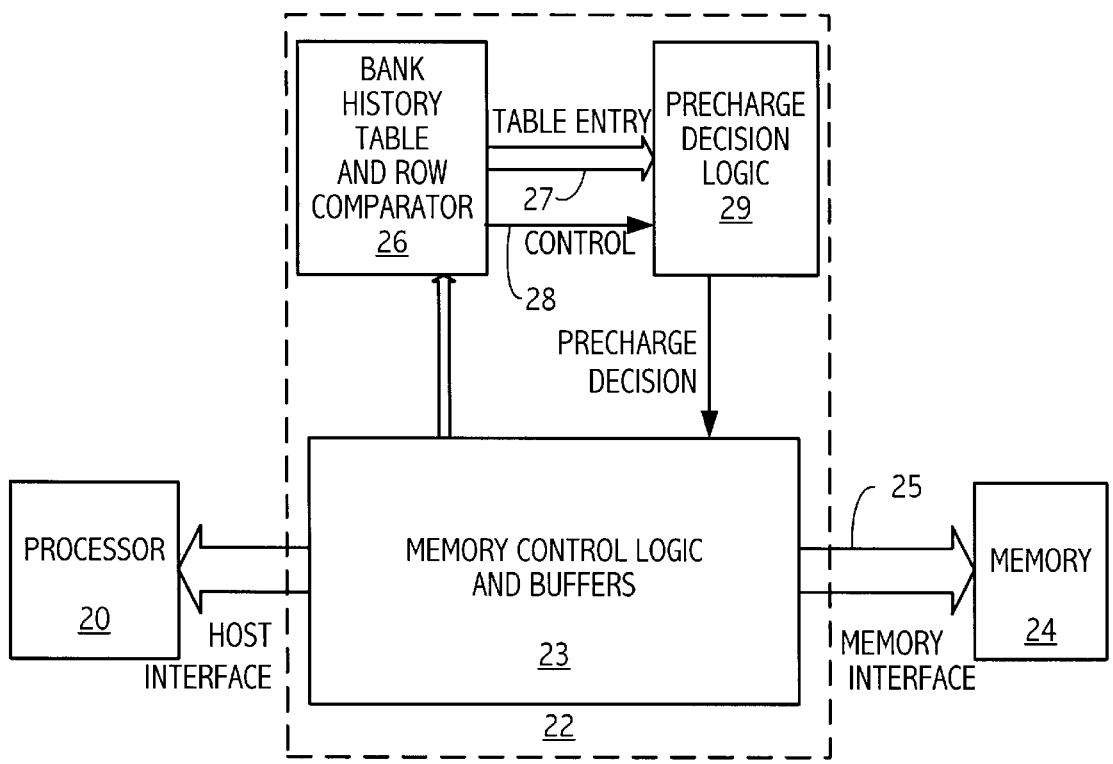
FIG. 2 shows a block diagram according to one embodiment of the present invention.

Referring to FIG. 2, a block diagram illustrates an exemplary computer system incorporating an embodiment of the present invention. The computer system includes processor or plurality of processors 20, coupled via the host interface 21 to memory controller 22 which includes memory control logic and buffers 23. The memory controller is also coupled to memory 24 via the memory interface 25. Memory 24 is organized in banks as shown in FIG. 1 and requires precharging for accessing a new row.

In order to dynamically determine whether or not to precharge, the memory controller includes bank history table and row comparator 26. The bank history table and row comparator 26 provides bank history table entry 27, a new history bit (not shown) and control signal 28 to the precharge decision logic circuit 29. The precharge decision logic circuit 29, after making a precharge decision based on the table entry 27 and new history bit, provides the memory control logic 23 with precharge decision signal 30. The precharge decision is made for the next memory access during the current memory access before the row address for the next memory access is known. The bank history table and precharge decision logic allows the memory controller to dynamically choose either to precharge immediately after an access or to delay precharge based on the history bits. If the precharge decision logic, using the data available from the history table and row comparator 26, determines that it is likely that there will be a row miss, it is more efficient to choose to precharge following the present access so that the precharge delay is incurred prior to the next bank access (while the bank is idle). On the other hand, if a subsequent row hit is more likely, it is more efficient to not precharge so that a re-read delay is not incurred on the next access (to the same row).

If the precharge decision logic determines that there will likely be a row hit, then no precharge occurs and the memory access proceeds without any precharge. If the row address turns out to be different, i.e., the precharge decision logic was wrong and there was not a row hit in that bank, then a precharge operation is performed and the read operation takes place. The penalty paid for the wrong prediction is the time it takes to precharge. The new row read operation would be necessary for a row miss, whether or not precharge had been performed earlier. Thus, there is a need to compare the precharge prediction with whether there was an actual row hit or miss on the predicted access to account for mispredicts. If the precharge decision logic errs by mispredicting a precharge operation which was not needed, the penalty paid is simply the time to re-read the row. The table below summarizes the penalties paid for mispredictions.

|  | ACTUAL HIT | ACTUAL MISS |
| --- | --- | --- |
| PREDICTED HIT | NO PENALTY | PRE-CHARGE PENALTY |
| PREDICTED MISS | ROW RE-READ PENALTY | NO PENALTY |

Memory control logic 23 precharges the appropriate bank sense amplifier (row buffer) according to the precharge decision supplied from the precharge decision logic circuit. The control signal 28 indicates there is valid history data and signals the precharge decision logic to compute a precharge decision 30.

The present invention differs from traditional access prediction (i.e. branch prediction) in several ways. For example, the access prediction of the present invention is performed by the memory controller rather than the processor and is not limited to predicting branches. In addition, the access prediction is for all accesses (no just instruction fetches). Also, the present invention is intended to predict a precharge operation not prefetching of instructions.

Figure 3:
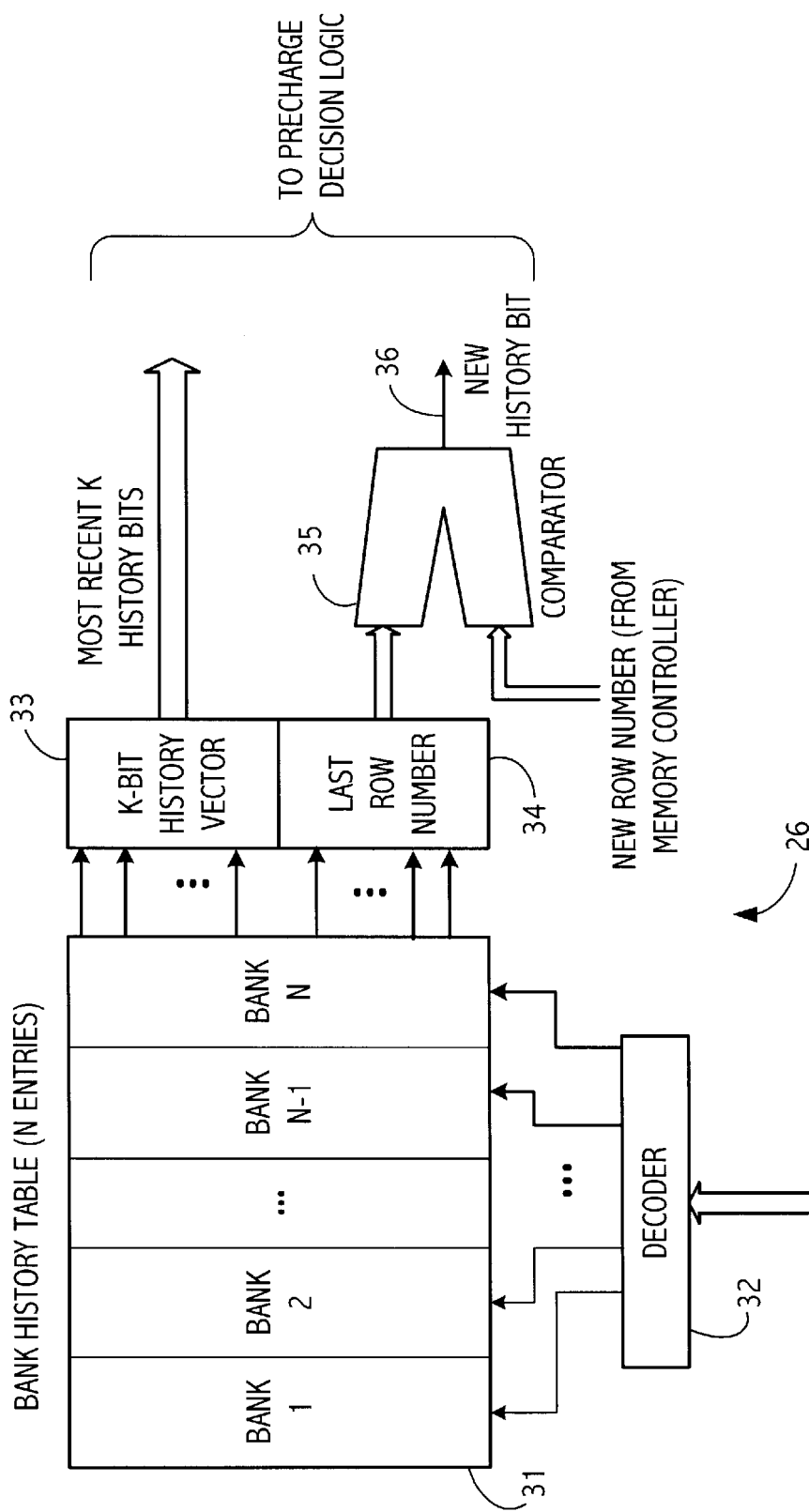
FIG. 3 shows details of the bank history table and the row comparator.

Referring to FIG. 3, the bank history table and row comparator 26 are shown in greater detail. Bank history table 31 includes entries for n banks. The number of entries depends on the number of banks in the memory system. An exemplary memory system may have 16 banks, or any number between one and an upper limit determined by the memory technology and cost structure. The bank entries are selected according to the high order address bits of the current row address which are supplied to decoder 32 to generate a bank address. Each entry in the bank history table includes a k-bit history vector 33 that contains the recent history of the memory accesses for that bank. Each bit of the history vector indicates whether sequential memory accesses to a bank were to the same row. If so, the bit in the memory vector is set to a one. If the next memory access was to a different row, the next bit in the memory vector is set to a zero to indicate that there was a row miss. Alternatively, the sense of the one and zero bits may be reversed. The size of the history vector may be, e.g., 8 bits, or such value as simulation or experience indicates is a good tradeoff between cost and accuracy. Thus, the history vector indicates whether there were row misses or hits, i.e. whether the access was to a row different from the immediately prior access in that bank, for the last eight memory transactions.

The history vectors may be implemented as a history of read accesses only. Alternatively, the history vector may include both read and write accesses. A common history vector for both read and write accesses may be maintained or separate history vectors that distinguish read from write accesses may be maintained.

In addition to the history vector, each entry in bank history table 31 includes the row address 34 of the last row accessed in that bank. When a read operation is occurring to a particular bank, the high order bits of the row address (the bank number) is provided to decoder 32 to obtain the history vector and the last row number accessed by that bank. The k-bit history vector is provided to precharge decision logic 29. In addition, the last row number 34 is provided to comparator 35, which compares the last row number with the current row number. The comparator 35 generates the newest history bit which indicates whether there is a row hit or miss for the current row. The new history bit is provided with the most recent k history bits to precharge decision logic 29.

Precharge decision logic 29 makes a precharge decision (prediction) according to the k-bits of the stored history vector and the new history bit. The precharge decision can be based on a number of approaches. For example, the precharge decision may be made on a simple majority basis. Thus, the precharge decision circuit in that implementation is a majority vote circuit that provides a negative precharge decision (that is, assume a row hit is coming so no precharge is necessary) when five or more of the nine history bits indicate a previous row hit. The nine bits assumes the history vector is eight bits and the new history bit is one bit.

Another precharge decision approach is to use weighted voting. In that implementation, the newer history bit(s) would be given an additional weight in the determination. Thus, for instance, the newest history bit may be given twice the weight as any of the other history bits or the newest history bit may be given an increased weight along with two of the most recent bits in the history vector. Other weighting schemes may also be used which would be apparent to those of skill in the art given the teachings herein. Note also that read and write accesses may be weighted differently. In general, any weighted average or any Boolean function of the k+1 history bits may be employed that experience or simulation indicates have good predictive accuracy.

Figure 4:
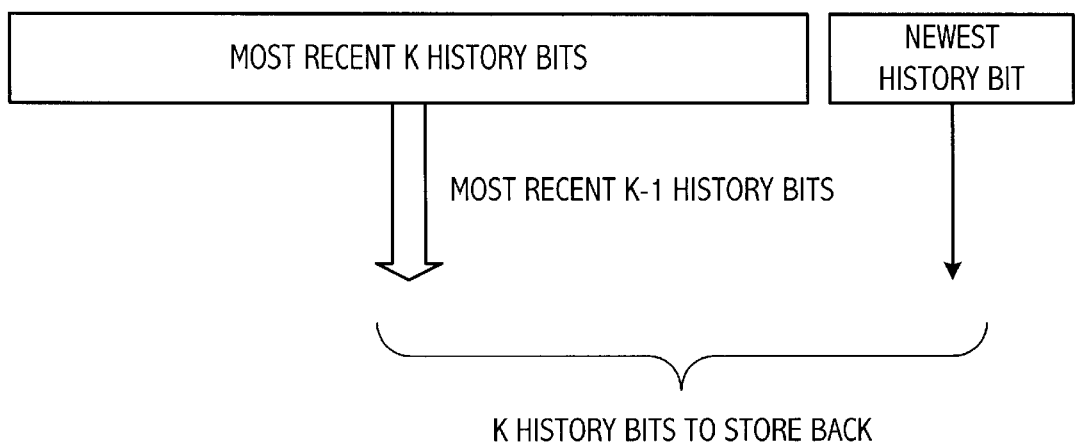
FIG. 4 shows the updated memory access history vector with the new history bit.

In addition to generating the newest history bit, the updated history vector needs to be stored back into the bank history table. Referring to FIG. 4, (k−1) history bits, e.g., 7 out of 8, are combined with the newest history bit to form an updated eight bit memory access history vector that is stored back into the relevant entry in the bank history table. Using the history bits, the memory controller can dynamically decide whether to precharge or not.

The description of the invention set forth herein is illustrative, and is not intended to limit the scope of the invention as set forth in the following claims. Variations and modifications of the embodiments disclosed herein, may be made based on the description set forth herein, without departing from the scope and spirit of the invention as set forth in the following claims.

What is claimed is:

1. An integrated circuit comprising:
   a bank history table having a plurality of memory access history vectors, each of the memory access history vectors corresponding to a respective one of a plurality of banks of memory; and
   a precharge decision circuit coupled to the bank history table to receive a selected one of the memory access history vectors and a new history bit, the precharge decision circuit determining a precharge decision for the memory using the selected one of the memory access history vectors and the new history bit.

2. The integrated circuit as recited in claim 1 wherein the selected history vector is comprised of a plurality of history bits, each bit indicating whether a consecutive first and second memory access was to a same row in the one bank.

3. The integrated circuit as recited in claim 2 further comprising:
   a plurality of entries in the bank history table, each entry corresponding to one the banks, each of the entries indicating a row number indicative of a row last accessed in a corresponding bank; and
   a comparator coupled to receive one of the entries corresponding to a current bank access and a row number indicative of the current bank access, the comparator outputting the new history bit indicative of whether the row number of the current bank access matches the row number last accessed in the corresponding bank.

4. The integrated circuit as recited in claim 3 further comprising:
   a decoder receiving at least a portion of the row number of the current access, the portion indicating a bank number, the decoder coupled to select an entry in the bank history table according to the bank number.

5. The integrated circuit as recited in claim 2 wherein the precharge decision circuit is a majority voting circuit, whereby the precharge decision circuit outputs a value indicative of the precharge decision, according to a value of the majority of the history bits and the new history bit.

6. The integrated circuit as recited in claim 2 wherein the precharge decision circuit is a weighted majority circuit, the precharge decision circuit giving predetermined recent bits of the memory access history vector and the new history bit more weight than older bits of the memory access history vector, the predetermined recent bits including at least the new history bit.

7. The integrated circuit as recited in claim 2 wherein the integrated circuit includes a memory controller for controlling the banks of memory.

8. The integrated circuit as recited in claim 2 wherein each of the history bits reflect one of a read access and a write access.

9. The integrated circuit as recited in claim 2 further comprising a read access history vector for read accesses and a write access history vector for write accesses, associated with each bank.

10. A computer system comprising:
    a microprocessor;
    a plurality of banks of memory for storing programs executable by the microprocessor;
    an integrated circuit including a memory controller coupled to the microprocessor and the banks of memory, the integrated circuit including,
    a bank history table having a plurality of entries, each entry corresponding to a respective one of the banks of memory, each of the entries including a memory access history vector; and
    a precharge decision circuit coupled to the bank history table, the precharge decision circuit providing a precharge decision according to one of the memory access history vectors provided from the bank history table and a new history bit.

11. A method of making a precharge decision for a memory having a plurality of banks of memory, comprising:
    providing a bank history table having a plurality of memory access history vectors, each of the memory access history vectors corresponding to a respective one of the banks of memory;
    providing one of the memory access history vectors to a precharge decision circuit according to a current bank address; and
    making a precharge decision using the one of the memory access history vectors.

12. The method as recited in claim 11 further comprising storing an indication of a last row accessed for each of the banks of memory.

13. The method as recited in claim 12 further comprising:
    selecting an entry in the bank history table according to the current bank address, the entry including the one memory access history vector and the indication of the last row accessed for the current bank address; and
    comparing the last row accessed in the entry with a current row address and providing an indication thereof as a new history bit.

14. The method as recited in claim 13 further comprising providing the new history bit to the precharge decision circuit, the precharge decision circuit determining a precharge operation according to the history bit and the one of the memory access vectors.

15. The method as recited in claim 13 further comprising storing the new history bit and a portion of the history vector corresponding to the bank address in an entry in the bank history table according to the bank address.

16. The method as recited in claim 11 wherein making the precharge decision includes determining a value of the majority of the history bits.

17. The method as recited in claim 11 wherein making the precharge decision includes:
    giving more weight to a predetermined number of recent bits of the history vector; and
    determining the precharge decision according to the weighted value of the history bits.

18. A precharge decision apparatus comprising:
    means for providing a plurality of history bits, each bit indicating memory access information; and
    means for making a precharge decision according to the plurality of history bits.

19. The apparatus as recited in claim 18 wherein the memory access information indicates whether a memory access was to a same row in a same bank of memory.

20. The apparatus as recited in claim 18 wherein the history bits include a stored history vector and a new history bit.

* * * * *